United States Patent
Uchaykin et al.

(10) Patent No.: US 8,355,765 B2
(45) Date of Patent: Jan. 15, 2013

(54) MAGNETIC VACUUM SYSTEMS AND DEVICES FOR USE WITH SUPERCONDUCTING-BASED COMPUTING SYSTEMS

(75) Inventors: Sergey V. Uchaykin, Burnaby (CA); Jacob Craig Petroff, Vancouver (CA); Gordon Lamont, New Westminster (CA)

(73) Assignee: D-Wave Systems Inc., Burnaby (CA)

( * ) Notice: Subject to any disclaimer, the term of this patent is extended or adjusted under 35 U.S.C. 154(b) by 348 days.

(21) Appl. No.: 12/865,341

(22) PCT Filed: Jan. 30, 2009

(86) PCT No.: PCT/US2009/032744
§ 371 (c)(1),
(2), (4) Date: Jul. 29, 2010

(87) PCT Pub. No.: WO2009/099972
PCT Pub. Date: Aug. 13, 2009

(65) Prior Publication Data
US 2011/0009274 A1    Jan. 13, 2011

Related U.S. Application Data

(60) Provisional application No. 61/025,243, filed on Jan. 31, 2008.

(51) Int. Cl.
*H01B 12/00* (2006.01)
(52) U.S. Cl. ....................................... 505/211
(58) Field of Classification Search ........... 505/16, 505/211, 872
See application file for complete search history.

(56) References Cited

U.S. PATENT DOCUMENTS

| | | | |
|---|---|---|---|
| 5,373,275 A * | 12/1994 | Itoh et al. | 335/216 |
| 6,830,775 B1 * | 12/2004 | Kawachi et al. | 427/62 |
| 7,687,938 B2 | 3/2010 | Bunyk et al. | |
| 2004/0234680 A1 * | 11/2004 | Kawachi et al. | 427/62 |
| 2006/0147154 A1 | 7/2006 | Thom et al. | |
| 2006/0225165 A1 | 10/2006 | Maassen van den Brink et al. | |
| 2008/0176750 A1 | 7/2008 | Rose et al. | |
| 2008/0238531 A1 | 10/2008 | Harris | |
| 2009/0102580 A1 | 4/2009 | Uchaykin | |

(Continued)

FOREIGN PATENT DOCUMENTS

| | | |
|---|---|---|
| EP | 0424835 A2 | 5/1991 |
| JP | 5114796 A | 5/1993 |
| KR | 10-1999-0046591 A | 7/1999 |

(Continued)

OTHER PUBLICATIONS

Maibaum et al., "Systems, Devices, and Methods for Analog Processing," U.S. Appl. No. 61/039,710, filed Mar. 26, 2008, 48 pages.

(Continued)

*Primary Examiner* — Colleen Dunn
(74) *Attorney, Agent, or Firm* — Seed IP Law Group PLLC (57) ABSTRACT

Magnetic shields and magnetic shielding systems are described. The excessive spatial demands of known mu-metal/cryoperm and superconducting shielding systems are reduced by a new multi-piece shield construction approach. A complete magnetic shielding system for use with superconducting-based computing systems, such as superconducting quantum computing systems, is also described. This complete system may include mu-metal/cryoperm shields and superconducting shields using either compensatory magnetic fields, expulsion by temperature gradients, or a combination of the two.

24 Claims, 5 Drawing Sheets

U.S. PATENT DOCUMENTS

| | | |
|---|---|---|
| 2009/0121215 A1 | 5/2009 | Choi |
| 2009/0122508 A1 | 5/2009 | Uchaykin et al. |
| 2009/0168286 A1 | 7/2009 | Berkley et al. |

FOREIGN PATENT DOCUMENTS

| | | |
|---|---|---|
| KR | 10-2003-0038109 A | 5/2003 |
| WO | 02091491 A1 | 11/2002 |

OTHER PUBLICATIONS

Pobell, Matter and Methods at Low Temperatures, Springer-Verlag, Second Edition, 120-156, 1996.

Thom et al., "Input/Output System and Devices for Use With Superconducting Devices," U.S. Appl. No. 12/016,801, filed Jan. 18, 2008, 132 pages.

Thom et al., "Input/Output System and Devices for Use With Superconducting Devices," U.S. Appl. No. 61/080,996, filed Jul. 15, 2008, 81 pages.

International Search Report, mailed Sep. 11, 2009, for PCT/US2009/032744, 2 pages.

Written Opinion, mailed Sep. 11, 2009, for PCT/US2009/032744, 3 pages.

* cited by examiner

MAGNETIC VACUUM SYSTEMS AND DEVICES FOR USE WITH SUPERCONDUCTING-BASED COMPUTING SYSTEMS

CROSS REFERENCE TO RELATED APPLICATIONS

This application is a U.S. national stage application filed under 35 U.S.C. §371 of International Patent Application PCT/US2009/032744, accorded an international filing date of Jan. 30, 2009, which claims benefit under 35 U.S.C. 119(e) of U.S. Provisional Patent Application Ser. No. 61/025,243, filed Jan. 31, 2008 and entitled "Magnetic Vacuum Systems and Devices for use with Superconducting Based Computing Systems", which is incorporated herein by reference in its entirety.

BACKGROUND

Field

This disclosure generally relates to magnetic vacuum systems and devices, and particularly relates to magnetic vacuum systems and devices for use with superconducting-based computing systems such as, for example, superconducting quantum computing systems.

Superconducting Quantum Processor

A computer processor may take the form of a quantum processor, such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165, US Patent Publication No. 2008-0176750, U.S. patent application Ser. No. 12/266,378, and U.S. Provisional Patent Application Ser. No. 61/039,710, filed Mar. 26, 2008 and entitled "Systems, Devices, And Methods For Analog Processing." A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in US Patent Publication No. 2006-0147154 and U.S. patent application Ser. No. 12/017,995. Respective coupling strengths of the coupling devices may be tuned between zero and a maximum value, for example, to provide ferromagnetic or anti-ferromagnetic coupling between qubits.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

Refrigeration

According to the present state of the art, a superconducting material may generally only act as a superconductor if it is cooled below a critical temperature that is characteristic of the specific material in question. For this reason, those of skill in the art will appreciate that a computer system that implements a superconducting (quantum) processor may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of refrigeration system.

BRIEF SUMMARY

At least one embodiment may be described as a magnetic shielding system for use with a superconducting-based computing system. The magnetic shielding system may include a first shield formed of a material of high magnetic permeability, the first shield comprising at least two sections that are mated together thereby defining an inner volume; and a superconducting shield formed of a material that is superconducting below a critical temperature, wherein the superconducting shield is at least partially enclosed within the inner volume of the first shield, and wherein at least a portion of the superconducting-based computing system is at least partially enclosed within the superconducting shield. The sections may be selectively detachably mated together, for example via one or more fasteners. The first shield may be formed of a material that includes at least one of mu-metal and cryoperm.

In some embodiments, the magnetic shielding system may further include a second shield formed of a material of high magnetic permeability, the second shield comprising at least two sections that are mated together thereby defining an inner volume, wherein the second shield is at least partially enclosed within the inner volume of the first shield, and wherein the superconducting shield is at least partially enclosed within the inner volume of the second shield. In some embodiments, the magnetic shielding system may also include at least one compensation coil that is formed of an electrically conductive wire, wherein the at least one compensation coil is positioned sufficiently proximate the superconducting shield that magnetic fields produced by the at least one compensation coil thread at least a portion of the superconducting shield.

At least one embodiment may be described as a magnetic shielding system comprising a first shield formed of a material of high magnetic permeability, wherein the first shield includes at least two sections that are mated together thereby defining an inner volume and at least two longitudinal mating seams. The material that forms the first shield includes at least one of mu-metal and cryoperm.

In some embodiments, the at least two sections may overlap along the at least two longitudinal mating seams to provide substantial contact surface area between the at least two sections of the first shield. The substantial contact surface area along the at least two longitudinal mating seams may provide a tortuous contact path.

In some embodiments, each of the at least two sections may include a respective set of through-holes that align when the at least two sections are mated. Such embodiments may further include a set of fasteners wherein each respective pair of aligned through-holes receives a respective one of the fasteners. The set of fasteners may include at least one of a nut and bolt combination, a screw, a nail, and a quarter-turn fastener.

In some embodiments, the magnetic shielding system may further comprise a second shield formed of a material of high magnetic permeability, wherein the second shield includes at least two sections that are mated together thereby defining an inner volume and at least two longitudinal mating seams, and wherein the second shield is at least partially enclosed within the inner volume of the first shield. The material that forms the second shield may includes at least one of mu-metal and cryoperm.

In some embodiments, the second shield may be oriented within the inner volume of the first shield such that each of the at least two longitudinal mating seams of the second shield are rotationally offset from each of the at least two longitudinal mating seams of the first shield. For example, the at least two longitudinal mating seams in the first shield may be positioned on approximately 180°-opposite sides of the first shield, and the at least two longitudinal mating seams in the second shield may be positioned on approximately 180°-opposite sides of the second shield, such that the difference between the rotational offset of longitudinal mating seams of the first shield is approximately 90° from the longitudinal mating seams of the second shield.

At least one embodiment may be described as a superconducting magnetic shielding system comprising a superconducting shield formed of a material that is superconducting below a critical temperature, wherein the superconducting shield includes at least two sections that are mated together thereby defining an inner volume and at least two longitudinal mating seams.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with analog processors, such as quantum processors, quantum devices, coupling devices and control systems including microprocessors and drive circuitry have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The various embodiments described herein provide systems and devices for realizing a magnetic vacuum environment. Such an environment can be beneficial in situations where it is desirable to reduce or minimize the presence of ambient magnetic fields. For example, it may be desirable to reduce the presence of magnetic fields in the operational environment of sensitive electronics, such as superconducting processors and superconducting quantum processors. Throughout this specification, various embodiments of the present systems and devices are described as being used with superconducting-based computing systems; however, those of skill in the art will appreciate that the present systems and devices may similarly be used to provide a magnetic vacuum environment for other applications.

Throughout this specification, the terms "magnetic vacuum" and "magnetic vacuum environment" are used to describe a volume that is at least partially shielded from external magnetic fields, such that the space within the volume is permeated with substantially less magnetic field than the space outside the volume. Such a volume is referred to herein as a "shielded enclosure." Those of skill in the art will appreciate that the term "vacuum" is used in an approximate sense, and it may not be necessary to completely eliminate all magnetic fields in order to produce an effective magnetic vacuum.

In some embodiments, the present systems and devices realize a magnetic vacuum environment by providing magnetic shielding at a plurality of nested stages. In some embodiments, the outermost stage may include at least one room temperature magnetic shield. The at least one room temperature magnetic shield may comprise a shielded enclosure formed by a shielding material, such as mu-metal or cryoperm. Both mu-metal and cryoperm are nickel-alloys of high magnetic permeability (e.g., with a maximum permeability typically in the range of 100,000 to 500,000) and are known in the art. Thus, throughout this specification, any reference to a "mu-metal" shield may be considered to also include embodiments that implement cryoperm shields, or shields made of any other material of high magnetic permeability. For the purposes of the present systems and devices, the term "high magnetic permeability" is used to describe a material with a maximum magnetic permeability on the order of 100,000.

In some embodiments, the at least one room temperature magnetic shield may be cylindrical in geometry, although other shapes may be used. In various embodiments, the two ends of the shielded enclosure may both be open, or they may both be closed, or one end may be open and the other end may be closed. Those of skill in the art will appreciate that mumetal shields may be incorporated into a system at a temperature other than room temperature. For example, in applications that include a refrigeration system, mu-metal shields may be positioned within at least a portion of the refrigeration system.

Magnetic shielding techniques that include mu-metal shields are known in the art. Known designs of such structures are single-piece cylindrical shields that are typically put in place by sliding the cylinder over the environment/structure to be shielded such that the cylinder completely encloses the environment/structure to be shielded. Alternatively, the structure to be shielded may be slid into the cylinder, while the position of the cylinder remains fixed. In either approach, it is necessary to ensure that there is sufficient space in the ambient environment that surrounds the cylinder such that the cylinder or contents may be slid into/out of position. Thus, it is typically necessary to provide a space that is approximately twice as long as the cylindrical shield itself. For example, in the case of a two-meter-long cylindrical shield that is intended to shield a two-meter-long environment/structure in a vertical or upright orientation, it is typically necessary to provide a room with a ceiling that is over four meters high such that there is sufficient space to slide the cylinder or environment/structure to be shielded into position. Clearly, the spatial demands of typical single-piece mu-metal shields are high, and this makes these devices impractical in applications where space is limited.

Figure 1A:
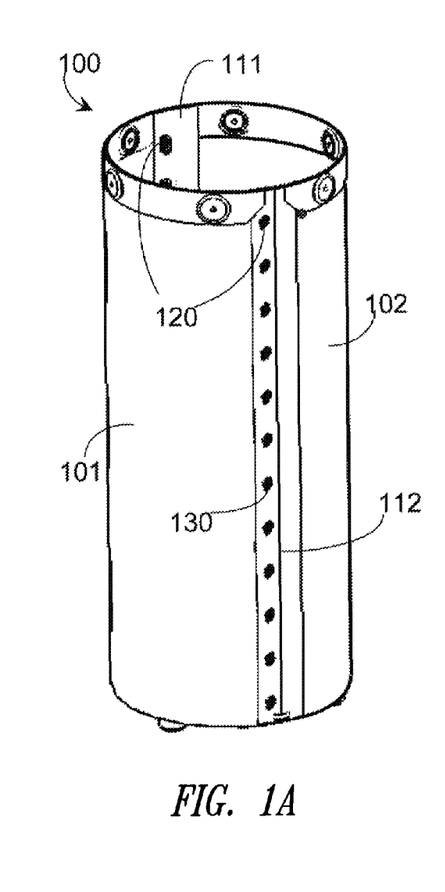
FIG. 1A is an isometric view of an embodiment of a mu-metal shield formed by two half-cylinders according to the present systems and devices.

The present systems and devices describe a mu-metal shield that is formed by at least two selectively mountable and dismountable sections. FIG. 1A shows an embodiment of a mu-metal shield 100 formed by two half-cylinders 101, 102. Half-cylinders 101 and 102 mate longitudinally to form the complete mu-metal shield 100. In the illustrated embodiment, this mating is established along two longitudinal edges or mating seams 111, 112 using fasteners 120 (only two called out in the Figure) that pass through through-holes 130 (only one called out in the Figure). Shield 100 is closed at one end (i.e., a bottom end, as illustrated) and longitudinal mating seams 111, 112 may connect on a bottom face of shield 100. Those of skill in the art will appreciate that, in alternative embodiments, mu-metal shield 100 may be open at both ends such that longitudinal mating seams 111 and 112 do not connect. Those of skill in the art will also appreciate that a mu-metal shield may be divided into a greater number of sections, and/or sections 101, 102 may be divided at a different point in the geometry of shield 100. For instance, in some embodiments section 101 may constitute more than a half-cylinder and section 102 may constitute less than a half-cylinder, such that when sections 101 and 102 are mated a full cylinder is still formed.

Figure 1B:
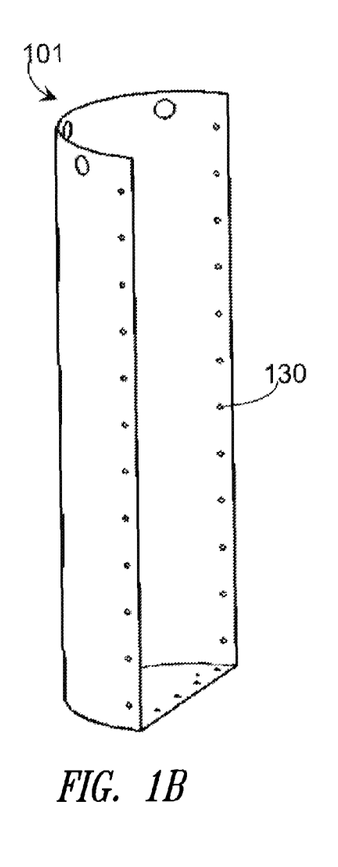
FIG. 1B is an isometric view of an embodiment of a first half-cylinder from a mu-metal shield according to the present systems and devices.

FIG. 1B shows an embodiment of a first half-cylinder section 101 of a mu-metal shield according to the present systems and devices. In FIG. 1B, the fasteners 120 are omitted so that through-holes 130 (only one called out in the Figure) are clearly visible.

Figure 1C:
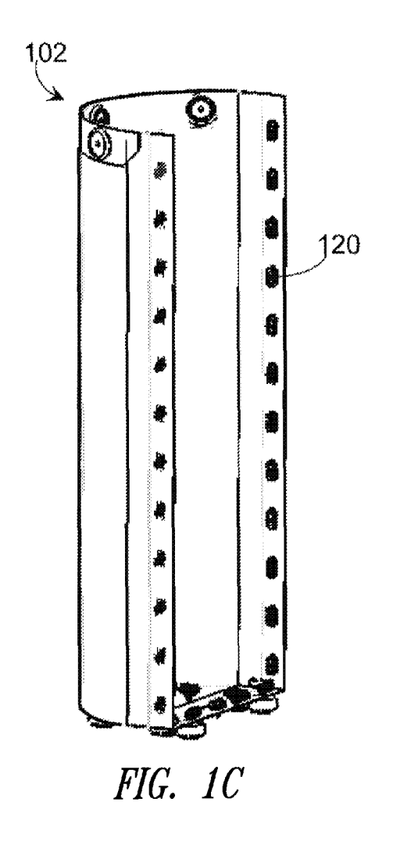
FIG. 1C is an isometric view of an embodiment of a second half-cylinder section from a mu-metal shield according to the present systems and devices.

FIG. 1C shows an embodiment of a second half-cylinder section 102 of a mu-metal shield according to the present systems and devices. In FIG. 1C, the fasteners 120 (only one called out in the Figure) are included, where each fastener 120 passes through a respective through-hole 130 in half-cylinder 102. To assemble shield 100, half-cylinders 101 and 102 are mated such that each through-hole 130 in half-cylinder 101 aligns with a respective through-hole 130 in half-cylinder 102. A respective fastener 120 passes through each pair of aligned through-holes and secures the two half-cylinders 101, 102 in position. In various embodiments, the fasteners 120 may take a variety of different forms. For example, in some embodiments fasteners 120 may be realized by nuts and bolts, screws, or nails. In other embodiments, fasteners 120 may be realized by quarter-turn fasteners or the like such as those supplied by Southco, Inc. of Concordville, Pa. These quarter-turn fasteners have the advantage of being fast and simple to activate/release. In some embodiments, longitudinal edges or mating seams 111 and 112 may each be covered on at least one side by a respective strip of mu-metal material. Similarly, some embodiments may include at least one mu-metal gasket to improve contact between the two mating half-cylinders 101, 102 and better approximate a continuous mu-metal cylinder.

In some applications, for example, in applications where the exterior space around the shield is limited, a shield that is formed by at least two selectively mountable and dismountable sections (such as shield 100) may be advantageous over a shield that is formed by one continuous piece. The installation/removal of mu-metal shield 100 simply involves clamping the two halves 101, 102 around the environment or structure to be shielded. This contrasts with sliding an entire one-piece mu-metal shield up and over the environment or structure to be shielded. Thus, shield 100 is more versatile than known mu-metal shields and may be used in applications where space is limited.

While shield 100 is advantageous in that it relaxes the spatial demands of known mu-metal shields, those of skill in the art will appreciate that multi-piece as opposed to single-piece shield construction can adversely affect shield performance. In order to reduce negative impacts on shield performance, it may be advantageous to pay particular attention to the connections between half-cylinders 101, 102. In some embodiments, it may be advantageous to ensure that there is significant overlap between sections 101, 102 to provide substantial contact surface area between the two sections 101, 102. In some embodiments, it can be advantageous to provide a tortuous path of contact surface area (such as tongues and grooves) between the two sections 101, 102 to reduce the passage of any penetrating magnetic fields. As previously described, longitudinal mating seams 111 and 112 may each be covered on at least one side by a respective strip of mu-metal material, and/or at least one mu-metal gasket may be implemented to better approximate a continuous mu-metal cylinder. In some embodiments, it may be advantageous to include at least one additional mu-metal shield nested within shield 100 to provide additional shielding.

Figure 2A:
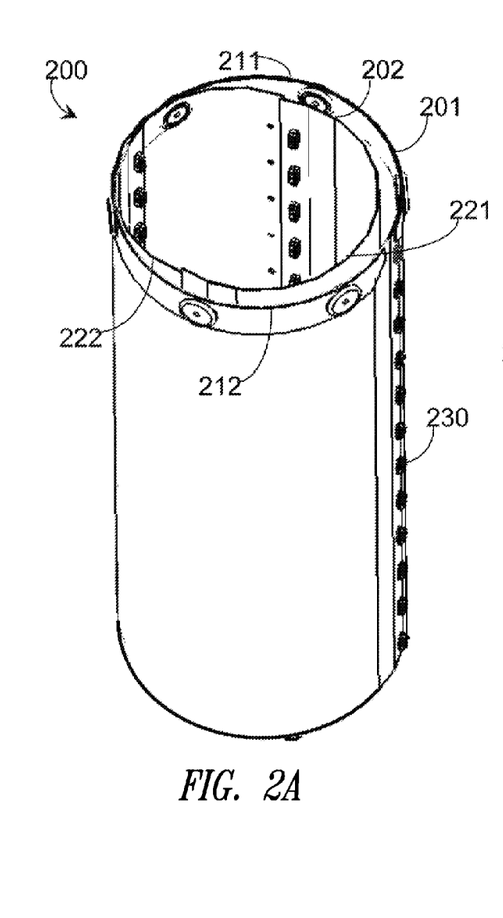
FIG. 2A is an isometric view of an embodiment of a mu-metal shielding system formed by two cylindrical shields, where one cylindrical shield is received or nested within the other cylindrical shield according to the present systems and devices.

FIG. 2A shows an embodiment of a mu-metal shielding system 200 formed by two cylindrical shields 201 and 202, where one cylindrical shield 202 is nested within the other cylindrical shield 201. In the illustrated embodiment, cylindrical shield 201 is formed by two mating half-cylinder sections 211, 212 and cylindrical shield 202 is formed by two mating half-cylinder sections 221, 222. The mating half-cylinder sections 211 and 212 and the mating half-cylinder sections 221 and 222 may be respectively connected together using fasteners 230 (only one called out in the Figure) passing through aligned through-holes. Thus, each of cylindrical shields 201 and 202 may be similar in some respects to shield 100 from FIG. 1A.

With cylindrical shield 202 nested within cylindrical shield 201, shielding system 200 may provide improved shielding performance relative to shield 100. Those of skill in the art will appreciate that any number of cylindrical shields may be used, where each additional cylindrical shield is nested within the previous cylindrical shield(s). Furthermore, throughout this specification various shields are described as being "cylindrical" in geometry. Those of skill in the art will appreciate that the present systems and devices may be applied using shields of other, non-cylindrical geometries, such as rectangular, hexagonal, octagonal, or triangular tubular geometries. However, in some applications, cylindrical geometries may be advantageous over other geometries.

As previously discussed, the multi-section construction of the shields shown in FIGS. 1A-1C and 2A may adversely affect shielding performance relative to continuous, single-piece shields that are typically seen in the art. Implementing multiple nested shields, such as shields 201 and 202 in shielding system 200, may reduce these adverse effects. A further benefit may be realized by considering the alignment of the at least two nested shields 201, 202. In some embodiments, it may be advantageous to ensure that the longitudinal seams defining the connections between half-cylinders 221, 222 of shield 202 are oriented away from the longitudinal seams defining the connections between half-cylinders 211, 212 of shield 201 and, if possible, such that there is no line of sight therebetween. For instance, in some embodiments cylindrical shield 202 may be rotated about a longitudinal axis by approximately 90° with respect to cylindrical shield 201.

Figure 2B:
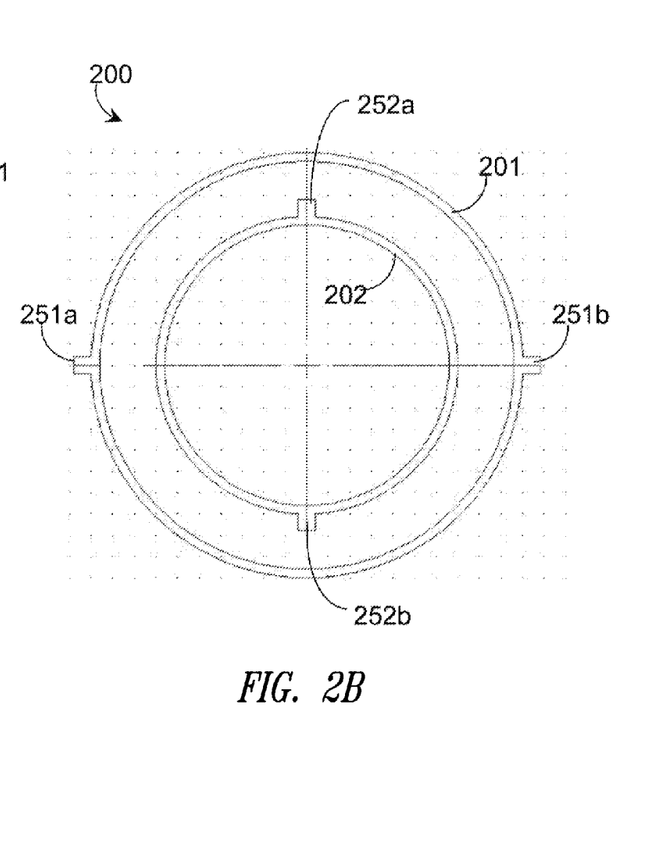
FIG. 2B is a top plan view of an embodiment of a mu-metal shielding system formed by a first cylindrical shield that is received or nested within a second cylindrical shield, where the first cylindrical shield is rotated about a longitudinal axis by approximately 90° with respect to a longitudinal axis of the second cylindrical shield such that respective mating seams of the first and the second cylindrical shields are not aligned or otherwise proximate with one another, according to the present systems and devices.

FIG. 2B shows an embodiment of a mu-metal shielding system 200 formed by a first cylindrical shield 202 that is nested within a second cylindrical shield 201, where the first cylindrical shield 202 is rotated about a longitudinal axis by approximately 90° with respect to the second cylindrical shield 201. The 90° offset of the two cylindrical shields 201, 202 may improve the shielding performance of shielding system 200 by helping to prevent magnetic fields that have penetrated longitudinal seams 251a, 251b of cylindrical shield 201 from penetrating longitudinal seams 252a, 252b of cylindrical shield 202.

As previously discussed, mu-metal shields are known in the art. However, the mu-metal shields described in the present systems and devices improve upon existing designs by eliminating the demand for excessive space in the ambient environment around the shielding system. It is also known in the art that an improved shielding factor may be realized by regularly demagnetizing a mu-metal/cryoperm shield. This demagnetization is typically achieved by controllably passing current through a demagnetization coil that wraps around the body of the shield. In some embodiments, the current may be sinusoidal with an amplitude that gradually increases over a number of wavelengths and then gradually decreases over a number of wavelengths. Thus, those of skill in the art will appreciate that the various embodiments of mu-metal shielding systems described herein may also include a demagnetization system including at least one demagnetization coil.

Mu-metal/cryoperm shields are typically used to shield an environment or structure from the magnetic fields of the Earth, as well as from electromagnetic interference. However, these shields are also known to develop residual magnetic fields themselves. These residual fields may vary based on the prehistory, mechanical stresses, and vibrations of the shield material. In some embodiments, it can be advantageous to include at least one additional shielding stage nested within the outer mu-metal/cryoperm shield. Thus, some embodiments of the present systems and devices include at least one superconducting shield nested within the mu-metal shielding system.

Systems, methods, and apparatus for superconducting magnetic shields are known in the art. Typically, a superconducting shield comprises a shielded enclosure that is formed by a shielding material that is superconducting below a critical temperature, such as aluminum, tin or lead. Using such a shield, there are at least two known techniques for providing magnetic shielding: compensation and expulsion.

In the compensation approach, magnetic field sensors are positioned within the shielded enclosure and coils of conductive wire ("compensation coils") are wrapped around (or at least, positioned in close proximity to) the outside of the shield. Current is passed through the compensation coils to generate compensatory magnetic fields that interfere with, and at least partially cancel out, the magnetic fields within the shielded enclosure. The magnetic field sensors are used to monitor the effective field present within the shielded enclosure. When the desired level of magnetic fields is measured, the system is cooled below the critical temperature of the shield such that the shield becomes superconducting. At this point, the compensatory magnetic fields are trapped, the fields within the shielded enclosure become approximately fixed, and the current through the compensation coils may be deactivated. Examples of compensation-based superconducting magnetic shielding systems, methods and apparatus are described in U.S. patent application Ser. No. 12/256,330 and U.S. patent application Ser. No. 12/262,417.

Figure 3:
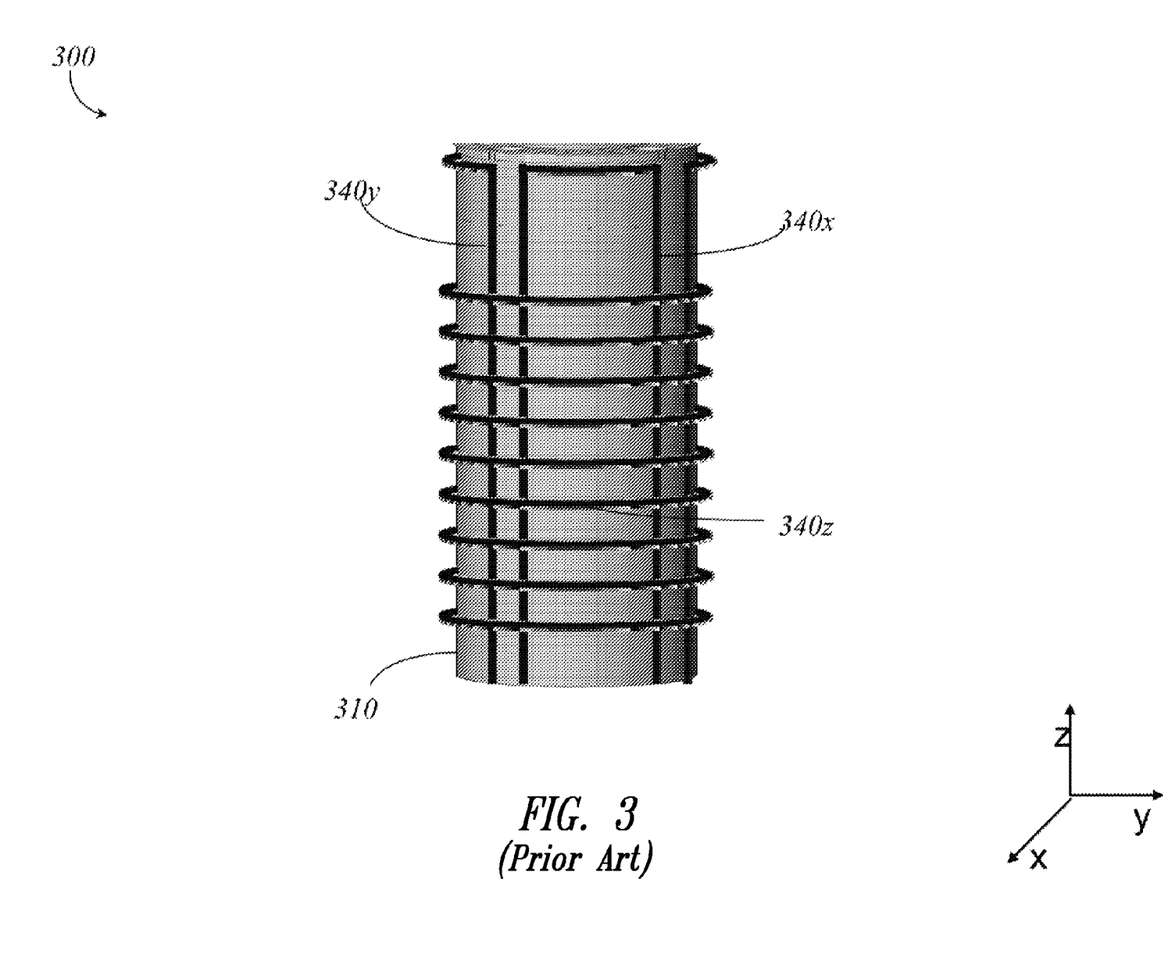
FIG. 3 is an isometric view of a compensation-based superconducting magnetic shielding system according to the present systems and devices.

FIG. 3 shows a compensation-based superconducting magnetic shielding system 300. System 300 includes a shield 310 formed of a material that is superconducting below a critical temperature, and three sets of compensation coils 340x, 340y, and 340z to produce compensatory magnetic fields in the x-direction, the y-direction, and the z-direction, respectively. Each of compensation coils 340x-340z is wrapped around the surface of shield 310, though those of skill in the art will appreciate that any or all of coils 340x-340z may be wrapped around an alternative surface that at least partially encloses shield 310. Coils 340x may be wrapped on opposing sides of shield 310 (only one side visible) to produce magnetic fields in the x-direction on opposing sides of shield 310. For instance, coils 340x as illustrated form a coil along the length of shield 310 on one side of shield 310. In some embodiments, a similar coil (or coils) may be formed diametrically opposite coil 340x along the opposing side of shield 310. Coils 340y may produce magnetic fields in the y-direction and may similarly be wrapped on diametrically opposite sides of shield 310.

For three-dimensional magnetic field compensation, it may be necessary to take three-dimensional measurements of the magnetic fields inside shield 310. This may be accomplished using a single three-dimensional measuring device, or multiple one-dimensional measuring devices each arranged to measure the fields in a respective direction. For example, shield 310 may include three measuring devices, such as magnetometers, each arranged to measure magnetic fields in a respective one of the x-, y-, and z-directions. System 300 may therefore include three electrical current control systems (not shown), or one electrical current control system that is capable of controlling all three directions of compensation. Those of skill in the art will appreciate that system 300 may be simplified to realize two-dimensional or one-dimensional magnetic shielding.

Alternatively, the expulsion approach to superconducting magnetic shielding may avoid the use of compensation coils and current control systems. In the expulsion approach, the system is controllably cooled to establish a temperature gradient across the shield 310. Specifically, a single point of the shield 310 may be cooled below its critical temperature such that that specific point of the shield 310 becomes superconducting first. The system is designed so that the rest of the shield 310 cools outwards from that point, and magnetic fields are expelled as the rest of the shield 310 gradually becomes superconducting. For instance, if the shield 310 is closed at the base and thermally coupled so that the base becomes superconducting first, magnetic flux may be expelled from the shielded enclosure as the superconductivity of the shield 310 gradually extends from the base to the top. In some embodiments, the expulsion approach may be accomplished passively by using a shield 310 of particular thermal conductivity and geometry that together allow a sufficient temperature gradient to form. In other embodiments, the expulsion approach may be accomplished actively by incorporating controllable heating devices and/or temperature sensors throughout the shielding system.

In designs of superconducting magnetic shields that are typically seen in the art, the superconducting shield is formed by one continuous piece. Although superconducting magnetic shields are typically substantially smaller than room temperature mu-metal/cryoperm shields, the single-piece construction that is typically seen in the art may still demand excessive space in the environment within or adjacent to the system for installation/removal of the superconducting shields. In accordance with the present systems and devices, superconducting magnetic shields may be formed of multiple sections in a similar fashion to that described for mu-metal shields 100, 201 and 202.

Figure 4:
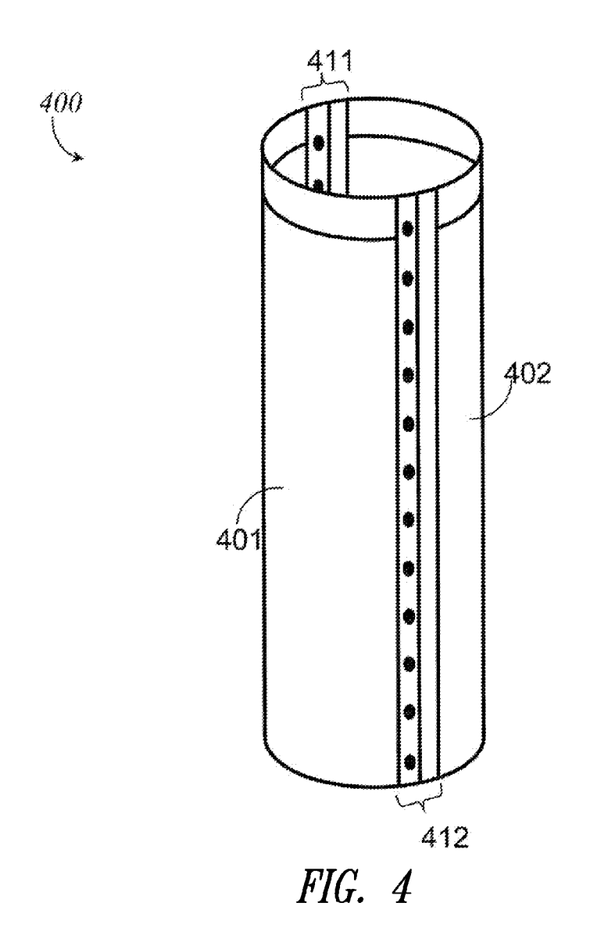
FIG. 4 is an isometric view of an embodiment of a cylindrical superconducting magnetic shield that is formed by two half-cylinders according to the present systems and devices.

FIG. 4 shows an embodiment of a cylindrical superconducting magnetic shield 400 that is formed by two half-cylinders 401 and 402. As illustrated, half-cylinders 401, 402 mate along longitudinal seams 411, 412; however, those of skill in the art will appreciate that, in alternative embodiments, shield 400 may be divided into sections of different geometries (e.g., other than half-cylinders) and seams 411, 412 may be alternatively positioned and aligned. The mating of half-cylinders 401 and 402 along longitudinal seams 411, 412 may be realized in a variety of ways. In some embodiments, this mating may be realized by aligned through-holes 430 and fasteners 420 similar to those described for shield 100 in FIGS. 1A-1C. However, because shield 400 is formed of a material that is superconducting below a critical temperature, in some embodiments it may be advantageous to use fasteners that are also formed of a material that is superconducting below a critical temperature. In this way, shielding performance may be enhanced as shield 400 better approximates a continuous superconducting shield. In some embodiments, it may be advantageous to provide a tortuous path (such as tongues and grooves) in the contact surface area between half-cylinders 401, 402 along seams 411, 412 to reduce passage of magnetic fields through any gaps along the seams 411, 412. In some embodiments, at least a portion of the connection interface between half-cylinders 401, 402 along seams 411, 412 may include a superconducting material acting, for example, as a superconducting gasket (not visible in FIG. 4) to help improve the superconducting seal along seams 411, 412. In such embodiments, it may be advantageous to use a soft superconducting metal, such as lead or indium, as the superconducting gasket.

A multi-piece superconducting shield, such as shield 400, may be used to provide magnetic shielding by either the compensation approach or the expulsion approach. In embodiments that use the compensation approach, shield 400 may be wrapped by at least one compensation coil, or by a set of at least two approximately orthogonal compensation coils, such as compensation coils 340x-340z shown in FIG. 3. In embodiments that use the expulsion approach, shield 400 may be designed to provide the desired temperature gradients, and the temperature gradients across seams 411, 412 may be considered accordingly.

In some embodiments of the present systems and devices, the mating of two half-cylinder sections of a cylindrical shield (such as shields 100, 201, 202, and 400) may be accomplished by welding the two sections together along the seams (such as mating seams 111, 112 and 411, 412). Welded shields may also be annealed to strengthen the connection along the seams.

Throughout this specification and the appended claims, reference is often made to a refrigeration system. As previously discussed, a refrigeration system may include a dilution refrigerator. In various embodiments, a refrigeration system may include at least one component selected from the group consisting of: pulse tube cryocoolers, cryogenic cycle refrigerators, adsorption pumps, gas-gap heat switches, evaporation pots, condensation surfaces, liquid helium-3 coolant, liquid helium-4 coolant, and a mixture of liquid helium-3 coolant and liquid helium-4 coolant. In some embodiments, the present systems and devices may be combined with at least one of the refrigeration systems described above. In other embodiments, the present systems and devices may be used with other forms of refrigeration systems.

Throughout this specification, reference is often made to an "environment or structure to be shielded." Those of skill in the art will appreciate that, in various embodiments, the present systems and devices may be adapted to provide shielding for a wide range of applications. As an example, the present systems and devices may be used to provide magnetic shielding for superconducting-based computing systems, such as superconducting quantum computing systems.

In some embodiments, a superconducting-based computing system may include an input/output system such as, for example, the input/output systems described in U.S. patent application Ser. No. 12/016,801, U.S. patent application Ser. No. 12/256,332, and U.S. Provisional Patent Application Ser. No. 61/080,996, filed Jul. 15, 2008 and entitled "Input/Output System and Devices for Use with Superconducting Devices." In such embodiments, the "environment or structure to be shielded" may include the superconducting computer processor and at least a portion of the input/output system. Thus, at least one embodiment of the present systems and devices describes a superconducting-based computing system that is at least partially enclosed by a superconducting magnetic shielding system, wherein the superconducting magnetic shielding system is at least partially enclosed by a mu-metal magnetic shielding system.

Figure 5:
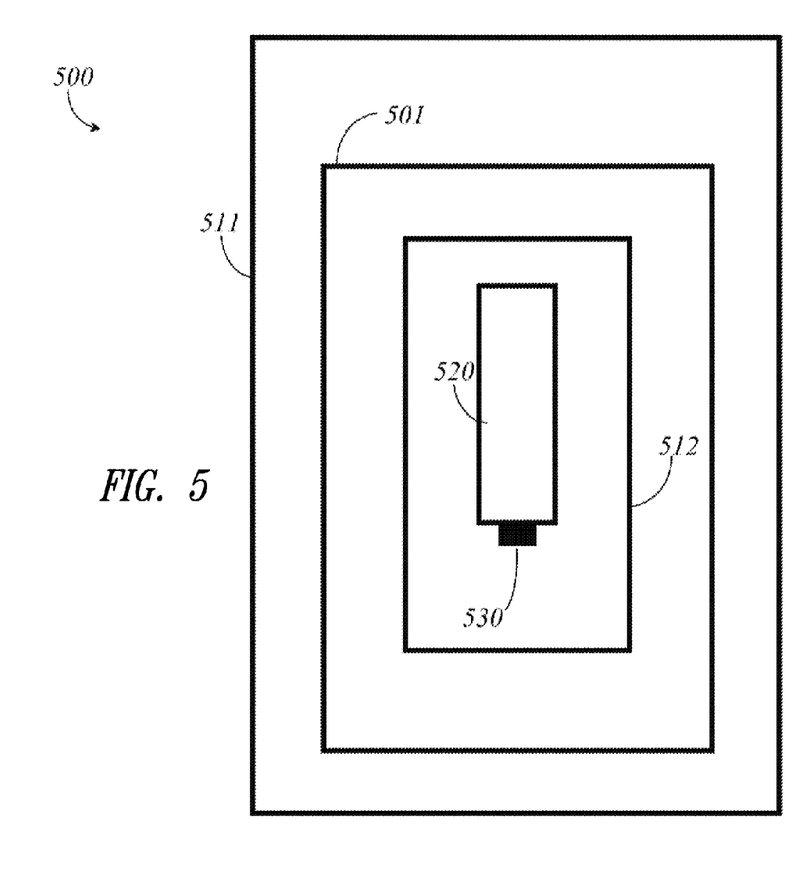
FIG. 5 is a schematic diagram of an embodiment of a superconducting-based computing system that includes a refrigeration system and a multi-stage magnetic shielding system according to the present systems and devices.

FIG. 5 shows an embodiment of a superconducting-based computing system 500 that includes a refrigeration system 501 and a multi-stage magnetic shielding system 511, 512. Stage 511 of the magnetic shielding system may include at least one mu-metal magnetic shield, and stage 512 of the magnetic shielding system may include at least one superconducting magnetic shield implementing either the compensation approach, the expulsion approach, or a combination of the compensation approach and the expulsion approach. System 500 also includes an input/output system 520 that provides electrical and thermal communication to/from superconducting computer processor chip 530. In some embodiments, chip 530 may include an analog processor. In some embodiments, chip 530 may include a superconducting quantum processor.

Furthermore, some embodiments of the present systems and devices may include magnetic shielding at the level of the superconducting processor chip itself. Such shielding may be accomplished passively, as described in U.S. patent application Ser. No. 11/948,817, or actively as described in U.S. patent application Ser. No. 12/256,330.

FIG. 5 illustrates an exemplary embodiment of a superconducting-based computing system 500 that includes a refrigeration system 501 and multiple stages 511, 512 of a magnetic shielding system. Those of skill in the art will appreciate that the nested arrangement of these systems (that is, mu-metal shields 511 containing refrigeration system 501, which itself contains superconducting magnetic shields 512, which contain at least a portion of input/output system 520 and chip 530) may vary in alternative embodiments. For instance, in some embodiments, mu-metal shielding system 511 may be contained within refrigeration system 501. Furthermore, those of skill in the art will appreciate that input/output system 520 may interface with room temperature electronics systems and/or other electronics systems not shown in FIG. 5 and positioned outside of mu-metal shielding system 511.

The various embodiments of cylindrical shields described in the present systems and devices are illustrated as being open at one end and closed at the other end. A closed end is advantageously provided to better encompass the shielded enclosure with shielding material and thereby improve shield performance. An open end is provided to facilitate communication (e.g., input/output electrical communication) between components inside and outside of the shielded enclosure. In some embodiments, it may be advantageous to include a mu-metal (or cryoperm, etc.) "lid" designed to mate with, and thereby at least partially close, the open end of a mu-metal shield and/or a superconducting shield. Such a lid may be formed to accommodate passage of at least one communication conduit therethrough, including for example a portion of the input/output system. For example, a cryoperm lid may be shaped to mate with the open end of superconducting shield 400, and the lid may include at least one through-hole to provide passage of electrical cables.

Some embodiments of the present systems and devices may include at least one radiation shield enclosed by at least one of a mu-metal shielding system and a superconducting magnetic shielding system. In some embodiments, a specific shield may be implemented that combines both radiation shielding and superconducting magnetic shielding into one structure, such as the structure described in U.S. patent application Ser. No. 12/262,417.

Those of skill in the art will appreciate that a refrigeration system may include at least one vacuum can designed to improve thermal isolation of the contents therein. In some embodiments of the present systems and devices, at least one vacuum can may also realize some magnetic shielding characteristics. In some embodiments, at least one magnetic shield may be sealed and evacuated to provide some degree of thermal isolation of the contents therein.

In some embodiments of the present systems and devices, an additional level of magnetic shielding may be realized by positioning the shielding system (mu-metal shields and/or superconducting shields and/or on-chip shields, etc.) and/or refrigeration system within a shielded room. An example of a shielded room is one in which all of the walls, including the door, and the ceiling and sometimes even the floor, are plated with a metal to effectively form a shielded enclosure defined by the walls of the room.

In accordance with the present systems and devices, some embodiments may include at least one cylindrical shield that is formed of one continuous piece of material. The fabrication of such a cylindrical shield may be achieved, for example, by spinning. Spun cylindrical shields may be formed relatively quickly and shaped to a high degree of precision. Spinning may be used to produce, for example, mu-metal shields, cryoperm shields, and/or superconducting shields.

As previously discussed, certain aspects of the present systems and devices may be realized at room temperature, and certain aspects may be realized at a superconducting temperature. Thus, throughout this specification and the appended claims, the term "superconducting" when used to describe a physical structure such as a "superconducting shield" is used to indicate a material that is capable of behaving as a superconductor at an appropriate temperature. A superconducting material may not necessarily be acting as a superconductor at all times in all embodiments of the present systems and devices.

The various embodiments described herein may generally be used to provide a magnetic vacuum environment within a shielded enclosure. The quality and effectiveness of such a magnetic vacuum environment may be improved by ensuring that the shielding systems, including the fasteners (e.g., fasteners 120, 230, and 420) are substantially free of ferromagnetic materials.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to superconducting-based computing systems and/or magnetic shielding systems and devices, not necessarily the exemplary superconducting-based computing systems and magnetic shielding systems and devices generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application Ser. No. 61/025,243, filed Jan. 31, 2008 and entitled "Magnetic Vacuum Systems and Devices for use with Superconducting Based Computing Systems", US Patent Publication No. 2006-0225165, US Patent Publication No. 2008-0176750, U.S. patent application Ser. No. 12/266,378, U.S. Provisional Patent Application Ser. No. 61/039,710, filed Mar. 26, 2008 and entitled "Systems, Devices, And Methods For Analog Processing", US Patent Publication No. 2006-0147154, U.S. patent application Ser. No. 12/017,995, U.S. patent application Ser. No. 12/256,330, U.S. patent application Ser. No. 12/262,417, U.S. patent application Ser. No. 12/016,801, U.S. patent application Ser. No. 12/256,332, U.S. Provisional Patent Application Ser. No. 61/080,996, filed Jul. 15, 2008 and entitled "Input/Output System and Devices for Use with Superconducting Devices", and U.S. patent application Ser. No. 11/948,817 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A magnetic shielding system for use with a superconducting-based computing system, comprising:
a first shield formed of a material of high magnetic permeability, the first shield comprising at least two sections that are selectively detachably mated together thereby defining an inner volume; and
a superconducting shield formed of a material that is superconducting below a critical temperature, wherein the superconducting shield is at least partially enclosed within the inner volume of the first shield, and wherein at least a portion of the superconducting-based computing system is at least partially enclosed within the superconducting shield.

2. The magnetic shielding system of claim 1 wherein the material that forms the first shield includes at least one of mu-metal and cryoperm.

3. The magnetic shielding system of claim 1, further comprising:
a second shield formed of a material of high magnetic permeability, the second shield comprising at least two sections that are mated together thereby defining an inner volume, wherein the second shield is at least partially enclosed within the inner volume of the first shield, and wherein the superconducting shield is at least partially enclosed within the inner volume of the second shield.

4. The magnetic shielding system of claim 1, further comprising:
at least one compensation coil that is formed of an electrically conductive wire, wherein the at least one compensation coil is positioned sufficiently proximate the superconducting shield that magnetic fields produced by the at least one compensation coil thread at least a portion of the superconducting shield.

5. The magnetic shielding system of claim 4 wherein at least one compensation coil is wrapped around the superconducting shield.

6. The magnetic shielding system of claim 1 wherein the superconducting-based computing system includes a superconducting quantum processor.

7. A magnetic shielding system, comprising:
a first shield formed of a material of high magnetic permeability, wherein the first shield includes at least two sections that are mated together thereby defining an inner volume and at least two longitudinal mating seams.

8. The magnetic shielding system of claim 7 wherein the material that forms the first shield includes at least one of mu-metal and cryoperm.

9. The magnetic shielding system of claim 7 wherein the at least two sections overlap along the at least two longitudinal mating seams to provide substantial contact surface area between the at least two sections of the first shield.

10. The magnetic shielding system of claim 9 wherein the substantial contact surface area along the at least two longitudinal mating seams provides a tortuous contact path.

11. The magnetic shielding system of claim 9 wherein each of the at least two sections includes a respective set of through-holes that align when the at least two sections are mated, and further comprising a set of fasteners wherein each respective pair of aligned through-holes receives a respective one of the fasteners.

12. The magnetic shielding system of claim 11 wherein the set of fasteners includes at least one of a nut and bolt combination, a screw, a nail, and a quarter-turn fastener.

13. The magnetic shielding system of claim 7, further comprising:
a second shield formed of a material of high magnetic permeability, wherein the second shield includes at least two sections that are mated together thereby defining an inner volume and at least two longitudinal mating seams, and wherein the second shield is at least partially enclosed within the inner volume of the first shield.

14. The magnetic shielding system of claim 13 wherein the material that forms the second shield includes at least one of mu-metal and cryoperm.

15. The magnetic shielding system of claim 13 wherein the second shield is oriented within the inner volume of the first shield such that each of the at least two longitudinal mating seams of the second shield are rotationally offset from each of the at least two longitudinal mating seams of the first shield.

16. The magnetic shielding system of claim 15 wherein the at least two longitudinal mating seams in the first shield are positioned on approximately 180°-opposite sides of the first shield, and wherein the at least two longitudinal mating seams in the second shield are positioned on approximately 180°-opposite sides of the second shield, and wherein the difference between the rotational offset of longitudinal mating seams of the first shield is approximately 90° from the longitudinal mating seams of the second shield.

17. The magnetic shielding system of claim 13 wherein the first shield is approximately cylindrical.

18. A superconducting magnetic shielding system, comprising:
a superconducting shield formed of a material that is superconducting below a critical temperature, wherein the superconducting shield includes at least two sections that are detachably mated together thereby defining an inner volume and at least two longitudinal mating seams.

19. The superconducting magnetic shielding system of claim 18 wherein the at least two sections overlap along the at least two longitudinal mating seams to provide substantial contact surface area between the at least two sections of the superconducting shield.

20. The superconducting magnetic shielding system of claim 19 wherein the substantial contact surface area along the at least two longitudinal mating seams provides a tortuous contact path.

21. The superconducting magnetic shielding system of claim 19 wherein each of the at least two sections includes a respective set of through-holes that align when the at least two sections are mated, and further comprising a set of fasteners wherein each respective pair of aligned through-holes receives a respective one of the fasteners.

22. The superconducting magnetic shielding system of claim 21 wherein at least one fastener is selected from the group consisting of: a superconducting nut and superconducting bolt combination, a superconducting screw, a superconducting nail, and a superconducting quarter-turn fastener.

23. The superconducting magnetic shielding system of claim 18 wherein the superconducting shield is approximately cylindrical.

24. The superconducting magnetic shielding system of claim 18, further comprising:
at least one superconducting gasket proximate at least a portion of each of the at least two longitudinal mating seams to provide continuous superconducting contact between the at least two sections of the superconducting shield.

* * * * *